United States Patent [19]

Kamon

[11] Patent Number: 5,294,505

[45] Date of Patent: Mar. 15, 1994

[54] PATTERN FORMING METHOD

[75] Inventor: Kazuya Kamon, Hyogo, Japan

[73] Assignee: Mitsubishi Denki Kabushiki Kaisha, Tokyo, Japan

[21] Appl. No.: 797,863

[22] Filed: Nov. 26, 1991

[30] Foreign Application Priority Data

Nov. 28, 1990 [JP] Japan ................................. 2-332171

[51] Int. Cl.⁵ .................................................. G03F 7/38
[52] U.S. Cl. ........................................ 430/3; 430/311; 430/322; 430/325; 430/328
[58] Field of Search ................ 430/3, 311, 322, 325, 430/328

[56] References Cited

U.S. PATENT DOCUMENTS

| | | | |
|---|---|---|---|
| 4,391,281 | 7/1983 | Green | 128/660 |
| 4,447,510 | 5/1984 | Frass | 430/3 |
| 4,521,092 | 6/1985 | Ferrante | 430/3 |
| 5,143,663 | 9/1992 | Leyden | 264/233 |

Primary Examiner—Marion E. McCamish
Assistant Examiner—Kathleen Duda
Attorney, Agent, or Firm—Lowe, Price, LeBlanc & Becker

[57] ABSTRACT

Disclosed herein is a method of forming a thin film pattern on a semiconductor substrate, which comprises a step of forming a photosensitive thin film on a semiconductor substrate, a step of exposing the photosensitive thin film with a fine pattern, a step of performing ultrasonic treatment on the exposed thin film, and a step of developing the ultrasonic-treated thin film for forming a fine pattern.

7 Claims, 5 Drawing Sheets

PATTERN FORMING METHOD

BACKGROUND OF THE INVENTION

1. Field of the Invention

The present invention relates to a pattern forming method which is applied to an optical lithography step in a semiconductor fabrication process.

2. Description of the Background Art

FIGS. 9 to 12 are sectional views for illustrating a conventional pattern forming method.

Referring to FIG. 9, a photosensitive resist film 2 is formed on a semiconductor substrate 1.

Then, exposure beams 3 are applied to prescribed regions of the resist film 2 to form photosensitized regions 4, as shown in FIG. 10.

Then, the exposed resist film 2 and the semiconductor substrate 1 are heat treated, as shown in FIG. 11.

Then, the heat treated thin film 2 is developed to form a fine pattern, as shown in FIG. 12.

In the conventional method, the resist film 2 is heat treated in advance of development as shown in FIG. 11, for the following reason:

FIG. 13 is a sectional view showing standing waves of exposure beams, which are formed in a photosensitive thin film. In recent years, a semiconductor device has been improved in degree of integration, leading to refinement of a resist pattern therefor. In order to attain such refinement of the resist pattern, exposure beams to be applied to a resist film are prepared in the so-called coherent state, with employment of monochromatic light or light which is composed of a narrow band of wavelengths. Such coherent exposure beams cause a problem of a standing wave effect in the resist film. When coherent exposure beams 3 are applied to a resist film 2 as shown in FIG. 13, multiple reflection is caused between the underlayer for the resist film 2 and the surface thereof. The reflected light components, which progress in opposite directions, overlap with each other to form standing waves 5. Such interference of the exposure beams alternately causes portions having strong exposure intensity, which correspond to loops of the standing waves, and those having weak exposure intensity, which correspond to nodes thereof. Consequently, the portions having strong exposure intensity are alternately stacked with those having weak exposure intensity. When the resist film 2 is of a positive type, the portions having strong exposure intensity are easily developed while those having weak exposure intensity are hardly developed, to cause uneven development. Thus, it is impossible to form a resist pattern in high accuracy.

IEEE Transactions of Electron Devices, Vol. ED-22, No. 7, July 1975, pp. 464-466 discloses a conventional method for solving such a problem of the standing wave effect by heat treating an exposed film in advance of development.

FIG. 14 is a sectional view typically showing a state of heat treating an exposed thin film in accordance with the aforementioned conventional method. Upon such heat treatment, molecules 6 of a photosensitive material which is contained in a resist film 2 thermally move as typically shown in FIG. 14. Therefore, a waving section of a photosensitized region 4 is flattened, so that uneven development is averaged.

However, since the molecules of the photosensitive material thermally move in an isotropic manner upon heat treatment, the film is vibrated in both vertical and transverse directions. While uneven development is reduced by the vertical vibration, the transverse vibration causes deterioration of a fine pattern.

FIG. 15 illustrates concentration distribution of the photosensitive material contained in the thin film, which has been heat treated as shown in FIG. 14. As understood from FIG. 15, the concentration distribution of the photosensitive material is loosely increased and decreased in boundary portions between the photosensitized region and non-photosensitized regions, with no abrupt concentration change. Therefore, a pattern region to be developed is extremely changed depending on concentration of a developing solution or change of the developing time, to reduce accuracy in pattern formation.

Further, the resist film, which is formed of an organic substance, may be thermally denatured by such heat treatment according to the conventional method, to reduce accuracy of the resist pattern.

SUMMARY OF THE INVENTION

An object of the present invention is to provide a pattern forming method which can solve such problems of the prior art for accurately forming a pattern by homogenizing unevenness of a photosensitized region with no heat deterioration of a resist film.

The inventive pattern forming method, which is adapted to form a thin film pattern on a semiconductor substrate, comprises the steps of forming a photosensitive thin film on a semiconductor substrate, exposing the photosensitive thin film with a fine pattern, performing ultrasonic treatment on the exposed thin film, and developing the ultrasonic-treated thin film for forming a fine pattern.

According to the inventive method, ultrasonic treatment is performed on an exposed thin film in advance of development, to homogenize unevenness in distribution of a photosensitive material, which is caused by standing waves during exposure. According to this method, no heat deterioration of a resist film is caused since no heat treatment is performed dissimilarly to the conventional method. Although heat may be slightly generated by the ultrasonic treatment, the quantity of such heat is extremely small as compared with that generated by heat treatment. Thus, the resist film will not be heat-deteriorated by the ultrasonic treatment.

The ultrasonic waves, which are compression waves, are mainly vertically vibrated with smaller transverse vibration causing pattern deterioration. Thus, it is possible to homogenize unevenness of the photosensitized region with no pattern deterioration.

In the ultrasonic treatment step according to the present invention, therefore, it is preferable to substantially perpendicularly introduce the ultrasonic waves into the thin film. In order to further positively attain vibration only in the vertical direction, it is preferable to carry out the ultrasonic treatment step with a medium of an inactive liquid. Such an inactive liquid may be prepared from a fluorine-base inactive liquid.

When the ultrasonic treatment step is carried out with an inactive liquid having large specific gravity, it is possible to float a thin film, which is to be ultrasonic-treated, on this inactive liquid. In this case, the ultrasonic treatment step can be simplified since it is not necessary to raise up the wafer from the liquid after the ultrasonic treatment.

In the ultrasonic treatment step, further, the semiconductor substrate is preferably provided with a sound absorbing material on its back surface. Such a sound absorbing material is adapted to absorb the ultrasonic waves and remove standing waves in the resist film, thereby allowing homogeneous molecular movement. The sound absorbing material may be prepared from rubber or an elastic material.

While the ultrasonic waves are not particularly restricted in wavelength, it is preferable to use ultrasonic waves of 0.01 to 10 μm in wavelength in the ultrasonic treatment step. Further, it is more preferable to use ultrasonic waves which are close in wavelength to standing waves of exposure beams.

FIG. 1 is a sectional view typically showing a state of applying ultrasonic waves to an exposed thin film according to the present invention. Referring to FIG. 1, a resist film 12 is formed on a semiconductor substrate 11. A photosensitized region 14 is formed in the resist film 12 by exposure. An ultrasonic generator 13 applies ultrasonic waves to the resist film 12, so that molecules 15 of a photosensitive material which is contained in the resist film 12 are vertically vibrated as shown in FIG. 1. Therefore, photosensitive material molecules which are contained in the photosensitized region 14 are also vertically vibrated to flatten a waving pattern section of the photosensitized region 14, thereby homogenizing uneven development.

FIG. 2 illustrates concentration distribution of the photosensitive material contained in the thin film, which has been subjected to ultrasonic treatment as shown in FIG. 1. As understood from FIG. 2, the concentration of the photosensitive material is abruptly changed in boundary portions between the photosensitized region and non-photosensitized regions, as compared with that of the conventional case shown in FIG. 15. According to the present invention, therefore, it is possible to form a resist pattern in higher accuracy than the conventional case.

The resist film is not thermally denatured since no heat treatment is performed dissimilarly to the conventional case.

According to the present invention, the ultrasonic treatment is performed on the exposed resist film in advance of development to vibrate the photosensitized region in the direction of film thickness, thereby homogenizing unevenness in photosensitization. According to the present invention, it is possible to prevent the resist film from thermal denaturation since no heat treatment is performed dissimilarly to the conventional case.

Further, it is possible to form an excellent pattern without transversely spreading the photosensitized region, since ultrasonic treatment mainly causes only vertical vibration.

According to the present invention, in addition, it is possible to remove foreign matters which may stick to the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

FIGS. 3 to 6 are sectional views for illustrating a pattern forming method according to the present invention.

Figure 1:
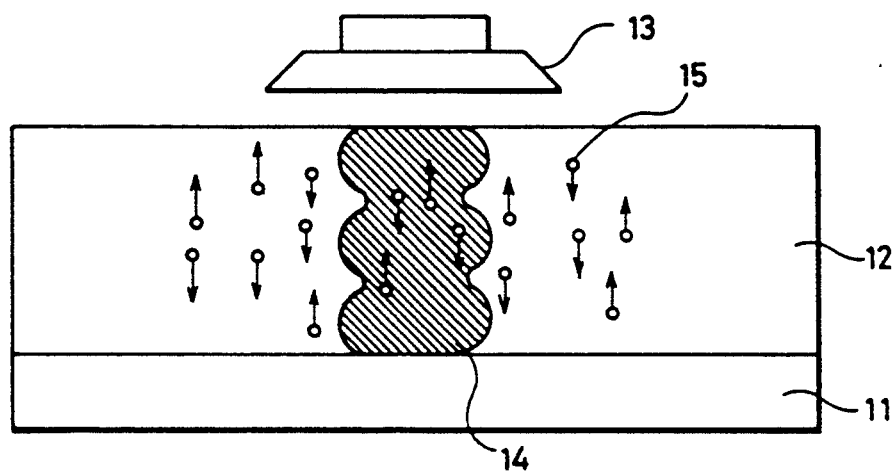
FIG. 1 is a sectional view typically showing a state of applying ultrasonic waves to an exposed thin film according to the present invention.
Figure 2:
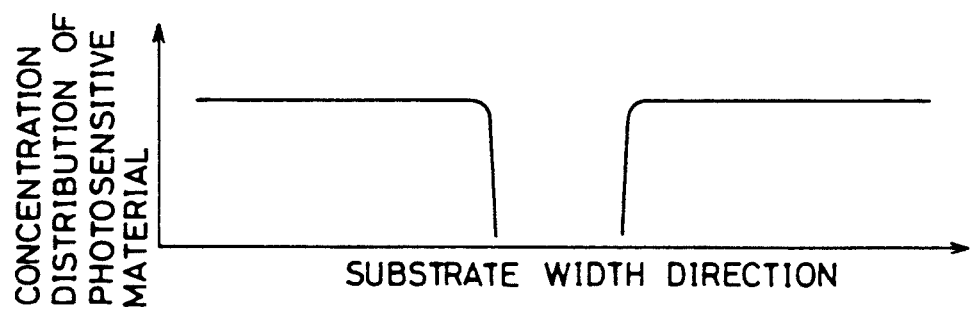
FIG. 2 illustrates concentration distribution of a photosensitive material contained in a thin film which has been subjected to ultrasonic treatment as shown in FIG. 1.
Figure 3:
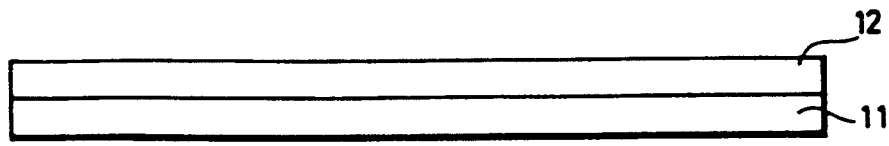
FIG. 3 is a sectional view showing a state of a photosensitive thin film which is formed on a semiconductor substrate according to the present invention.

Referring to FIG. 3, a photosensitive resist film 12 is formed on a semiconductor substrate 11.

Figure 4:
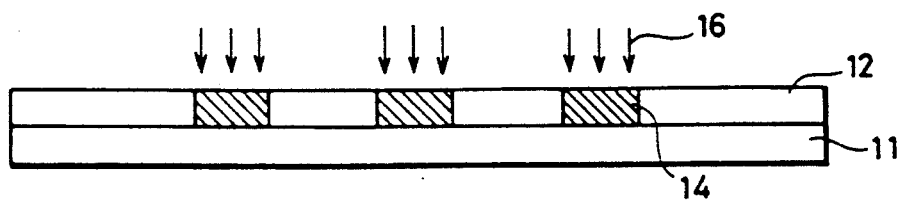
FIG. 4 is a sectional view showing the photosensitive thin film which is exposed with a fine pattern according to the present invention.

Then, exposure beams 16 are applied to the resist film 12 as shown in FIG. 4, to form photosensitized regions 14.

Figure 5:
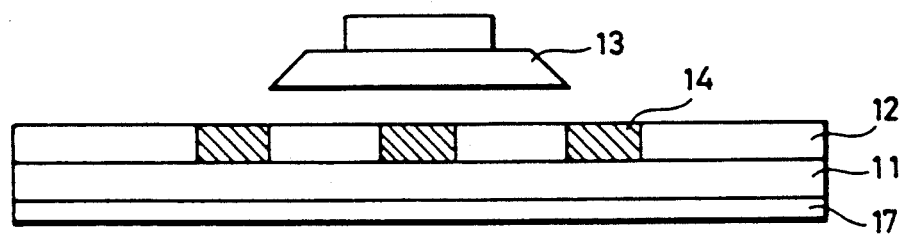
FIG. 5 is a sectional view showing a step of performing ultrasonic treatment on the exposed thin film according to the present invention.

Then, ultrasonic waves are applied to the exposed resist film 12 through an ultrasonic generator 13, as shown in FIG. 5. At this time, it is preferable to provide a sound absorbing material 17 on the back surface of the substrate 11, in order to remove standing waves of the ultrasonic waves and attain uniform molecular movement.

Figure 6:
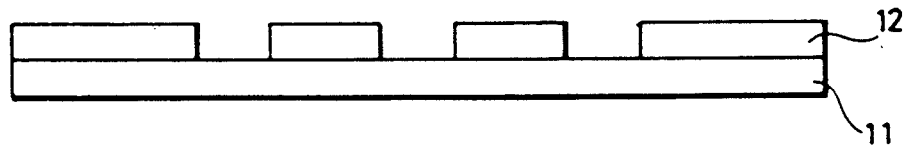
FIG. 6 is a sectional view showing the thin film which is subjected to the ultrasonic treatment and then developed to form a fine pattern according to the present invention.

Then, the ultrasonic-treated resist film 12 is developed to form a resist pattern on the semiconductor substrate 11, as shown in FIG. 6.

Figure 7:
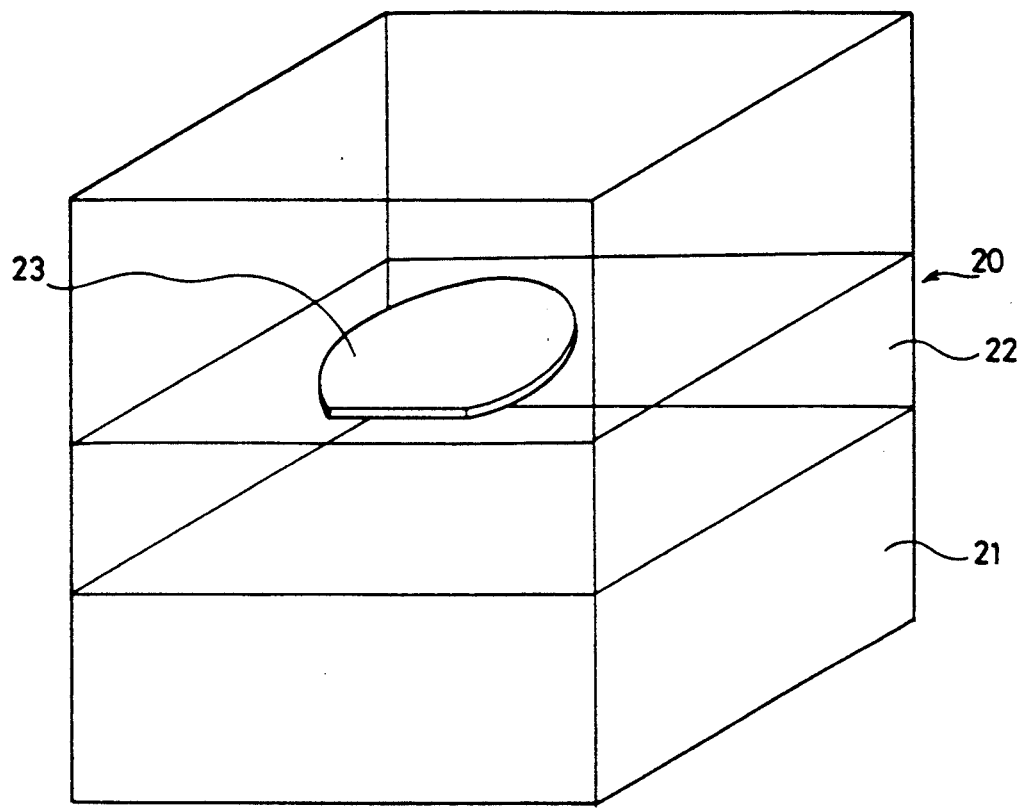
FIG. 7 is a perspective view showing an exemplary method of performing ultrasonic treatment according to the present invention.

FIG. 7 is a perspective view showing an exemplary method of performing ultrasonic treatment according to the present invention. Referring to FIG. 7, an ultrasonic generating part 21 is provided under an ultrasonic vessel 20. The ultrasonic vessel 20 contains a fluorine-based inactive liquid 22, such as FLUORINERT FC-5311 (trade name) by Sumitomo 3M Ltd. on the ultrasonic generating part 21. A wafer 23 is floated on this chemically inactive liquid 22, having its resist film in contact with a surface of the liquid.

Figure 8:
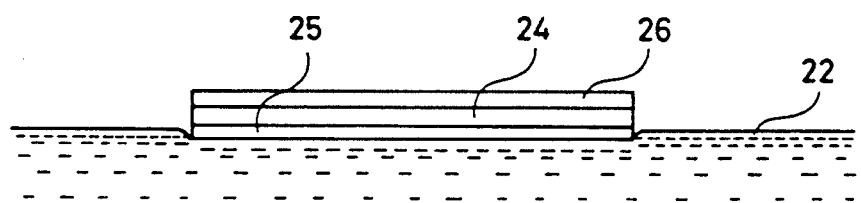
FIG. 8 is an enlarged sectional view illustrating the wafer shown in FIG. 7.
Figure 9:
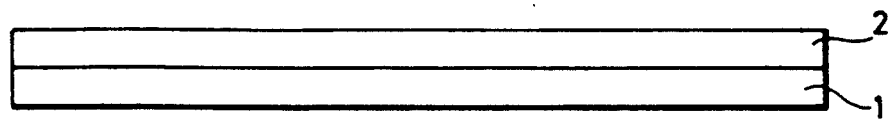
FIG. 9 is a sectional view showing a photosensitive thin film which is formed on a semiconductor substrate according to a conventional method.
Figure 10:
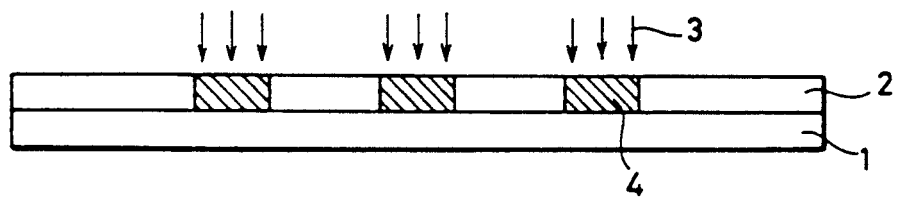
FIG. 10 is a sectional view showing the photosensitive thin film which is exposed with a fine pattern according to the conventional method.
Figure 11:
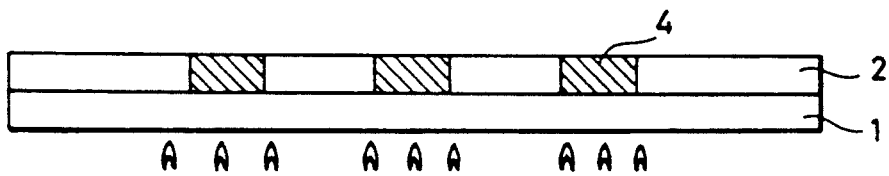
FIG. 11 is a sectional view showing a step of heat treating the exposed thin film according to the conventional method.
Figure 12:
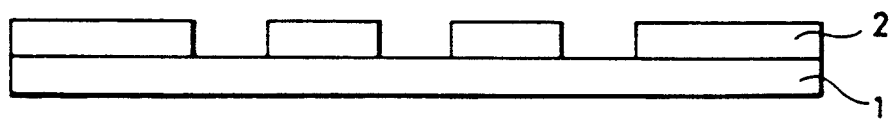
FIG. 12 is a sectional view showing the heat treated thin film which is developed to form a fine pattern according to the conventional method.
Figure 13:
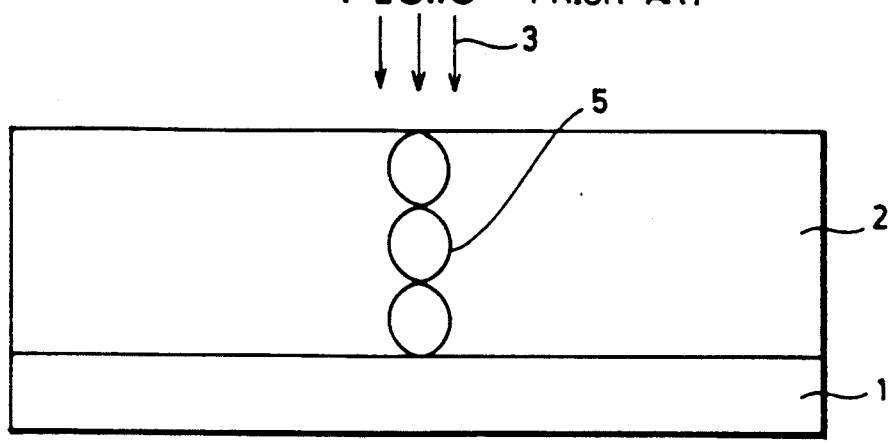
FIG. 13 is a sectional view showing standing waves of exposure beams which are formed in a photosensitive thin film.
Figure 14:
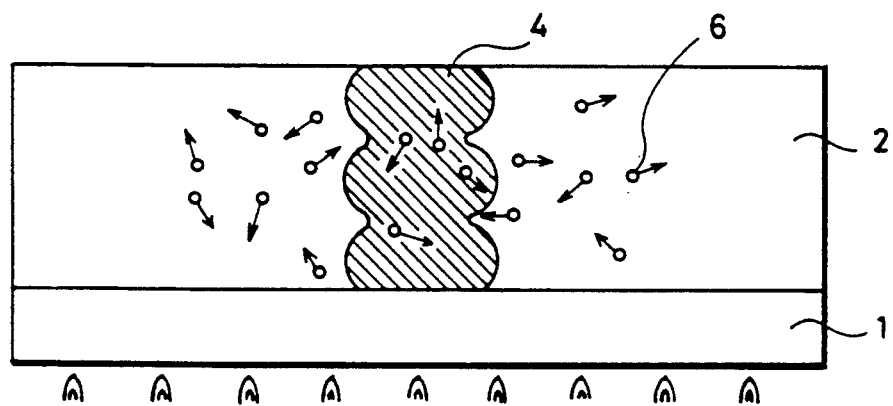
FIG. 14 is a sectional view typically showing a state of heat treating an exposed thin film according to the conventional method.
Figure 15:
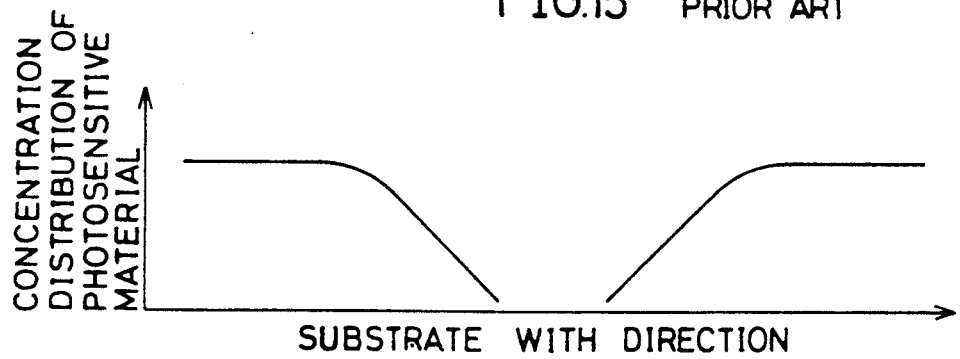
FIG. 15 illustrates concentration distribution of a photosensitive material contained in the thin film which has been heat treated in the step shown in FIG. 14.

FIG. 8 is an enlarged sectional view illustrating the wafer shown in FIG. 7. Referring to FIG. 8, a substrate 24 is provided with a resist film 25 and a sound absorbing material 26 on front and back surfaces respectively. This substrate 24 is floated on the inactive liquid 22, having the resist film in contact with a surface of the liquid 25.

The resist film 25 is prepared from a novolak-base resist material such as MCPR2000H (trade name) by Mitsubishi Chemical Industries Ltd. An Hg-g line is employed for exposure beams.

In the state shown in FIGS. 7 and 8, ultrasonic waves were applied to the resist film 25 from the ultrasonic wave generating part 21, for performing ultrasonic treatment. The ultrasonic waves were 0.2 μm in wavelength.

The resist film 25, which was ultrasonic-treated after exposure in the aforementioned manner, was then developed. As the result, it was possible to form a resist pattern in higher accuracy as compared with the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a thin film pattern on a semiconductor substrate, comprising the steps of:

forming a photosensitive thin film on said semiconductor substrate;

exposing a predetermined region on said photosensitive thin film to exposure beams;

performing ultrasonic treatment on said thin film to attain vibration only in a vertical direction using a medium of liquid while floating said thin film on the surface of said liquid; and thereafter developing said thin film for forming a fine pattern corresponding to said exposed predetermined region by removing said exposed predetermined region.

2. A method in accordance with claim 1, wherein said ultrasonic treatment step comprises a step of introducing ultrasonic waves into said thin film along a direction substantially perpendicular thereto.

3. A method in accordance with claim 1, wherein said liquid is a fluorine-based liquid.

4. A method in accordance with claim 1, wherein said ultrasonic treatment step comprises a step of performing ultrasonic treatment with ultrasonic waves of 0.01 to 10 μm in wavelength.

5. A method in accordance with claim 1, wherein said ultrasonic treatment step comprises a step of performing ultrasonic treatment with ultrasonic waves being close in wavelength to standing waves of the exposure beams.

6. A method in accordance with claim 1, including forming a sound absorber on a surface of said semiconductor substrate opposite said photosensitive thin film to absorb ultrasonic waves passing the photosensitive thin film during said step of ultrasonic treatment.

7. A method of forming a thin film pattern on a semiconductor substrate, comprising the steps of:

forming a photosensitive thin film on said semiconductor substrate;

exposing a predetermined region on said photosensitive thin film to exposure beams;

performing ultrasonic treatment on said thin film using a bath of liquid, while said thin film is maintained on the surface of said liquid; and thereafter developing said thin film for forming a fine pattern.

* * * * *